(12) United States Patent
Wang et al.

(10) Patent No.: US 9,964,822 B2
(45) Date of Patent: May 8, 2018

(54) ACTIVE ARRAY MATRIX SUBSTRATE OF DISPLAY PANEL

(71) Applicant: Century Technology (Shenzhen) Corporation Limited, Shenzhen (CN)

(72) Inventors: Ming-Tsung Wang, New Taipei (TW); Chih-Chung Liu, New Taipei (TW); Yi-Hsiu Cheng, New Taipei (TW); Zhi-Hong Chang, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 162 days.

(21) Appl. No.: 14/886,797

(22) Filed: Oct. 19, 2015

(65) Prior Publication Data
US 2017/0090259 A1    Mar. 30, 2017

(30) Foreign Application Priority Data
Sep. 24, 2015  (CN) .......................... 2015 1 0614820

(51) Int. Cl.
| | | |
|---|---|---|
| *G02F 1/1362* | (2006.01) | |
| *G02F 1/1343* | (2006.01) | |
| *H01L 27/32* | (2006.01) | |
| *G02F 1/1335* | (2006.01) | |

(52) U.S. Cl.
CPC .. *G02F 1/136286* (2013.01); *G02F 1/133514* (2013.01); *G02F 1/134336* (2013.01); *H01L 27/322* (2013.01); *H01L 27/3232* (2013.01); *H01L 27/3262* (2013.01); *H01L 27/3265* (2013.01); *H01L 27/3276* (2013.01)

(58) Field of Classification Search
CPC ......... G02F 1/134336; G02F 1/136286; G02F 1/136213; H01L 27/3262; H01L 27/3265; H01L 27/3276; H01L 28/40
See application file for complete search history.

(56) References Cited

U.S. PATENT DOCUMENTS

| | | | | |
|---|---|---|---|---|
| 2014/0253858 | A1* | 9/2014 | Kawano ............ | G02F 1/134336 349/143 |
| 2015/0070616 | A1* | 3/2015 | Ogasawara .......... | G02F 1/1339 349/43 |
| 2015/0268774 | A1* | 9/2015 | Xu ...................... | G02F 1/13338 345/173 |

(Continued)

FOREIGN PATENT DOCUMENTS

| | | |
|---|---|---|
| CN | 101776828 A | 7/2010 |
| CN | 102790093 A | 11/2012 |

*Primary Examiner* — Jessica M Merlin
(74) *Attorney, Agent, or Firm* — ScienBiziP, P.C.

(57) ABSTRACT

An active array matrix substrate of a display panel includes a number of scan lines parallel to each other and arranged in a first metal layer of a first substrate, a number of data lines parallel to each other and arranged in a second metal layer of the first substrate, a number of gate electrodes arranged in the first metal layer, a number of source electrodes arranged in the second metal layer, and a number of drain electrodes arranged in the second metal layer. The source electrode includes at least one source extending portion spaced from and configured to overlap with the first metal layer. The drain electrode includes at least one drain extending portion spaced from and configured to overlap with the first metal layer.

13 Claims, 8 Drawing Sheets

(56) References Cited

U.S. PATENT DOCUMENTS

2016/0048067 A1* 2/2016 Shim .................. H01L 27/1288
257/59
2016/0126260 A1* 5/2016 Chang .................. H01L 27/124
257/72

* cited by examiner

ACTIVE ARRAY MATRIX SUBSTRATE OF DISPLAY PANEL

FIELD

The subject matter herein generally relates to an active array matrix substrate of a display panel.

BACKGROUND

Generally, an active array matrix substrate of a display panel includes a first metal layer and a second metal layer. The first metal layer includes a plurality of scan lines and a plurality of gate electrodes, and the second metal layer includes a plurality of source electrodes and a plurality of drain electrodes. Proper alignment of the first metal layer and the second metal layer is important for ensuring good display quality of the display panel.

BRIEF DESCRIPTION OF THE DRAWINGS

Implementations of the present technology will now be described, by way of example only, with reference to the attached figures.

DETAILED DESCRIPTION

Figure 1:
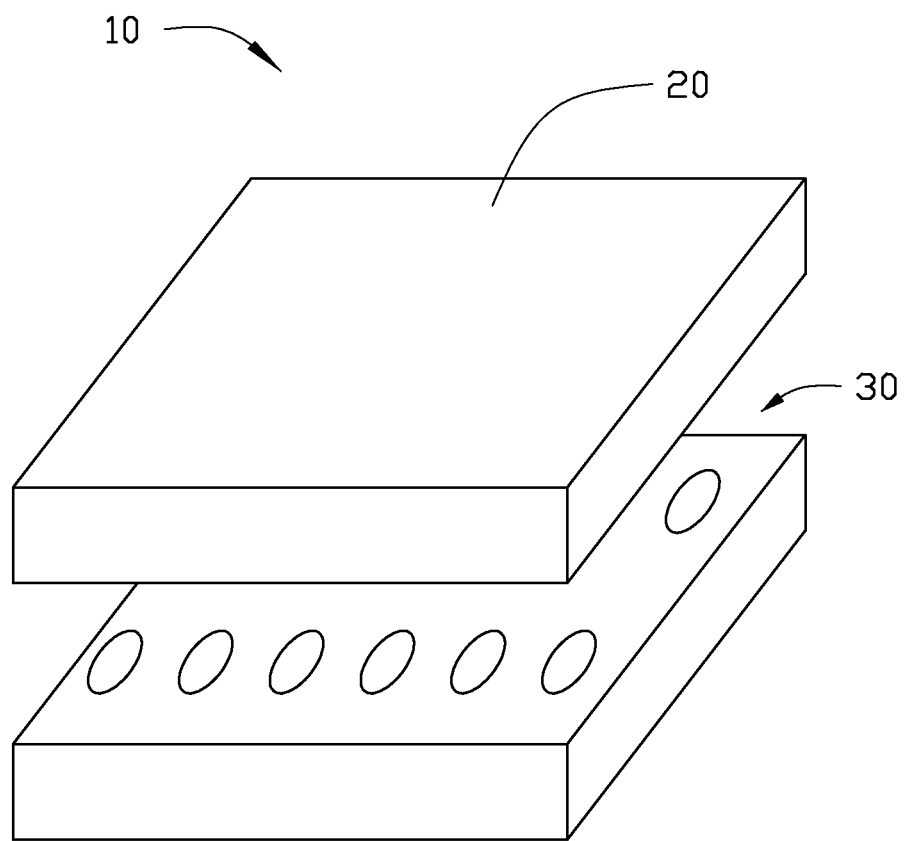
FIG. 1 is an exploded, isometric view of an embodiment of an active array matrix substrate of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an embodiment of an active array matrix substrate 1 (hereinafter "the substrate 1") of a display panel (not shown). In at least one embodiment, the active array matrix substrate 1 can be an organic light emitting diode (OLED) display panel. The substrate 1 can include a first substrate 10, a second substrate 20, and a liquid crystal layer 30. The first substrate 10 can be an array substrate, and the second substrate 20 can be a color filter substrate. The second substrate 20 can be arranged opposite to the first substrate 10. The liquid crystal layer 30 can be arranged between the first substrate 10 and the second substrate 20.

FIGS. 2-5 illustrate a first embodiment of the first substrate 10. The first substrate 10 can include a plurality of scan lines 12, a plurality of data lines 13, a plurality of gate electrodes 14, a plurality of source electrodes 15, a plurality of drain electrodes 16, and a plurality of pixel electrodes 18. The plurality of scan lines 12 can be substantially parallel to each other. The plurality of data lines 13 can be substantially parallel to each other and substantially perpendicular to the plurality of scan lines 12. The plurality of scan lines 12 can define a plurality of rows of spaces 181. Each row of spaces 181 can be bound by two adjacent scan lines 12. Two data lines 13 can be arranged between every two adjacent columns of spaces 181. Thus, the number of data lines 13 is twice the number of scan lines 12. Each of the spaces 181 can correspond in position to one corresponding gate electrode 14, one corresponding source electrode 15, one corresponding drain electrode 16, and one corresponding pixel electrode 18. The gate electrode 14 can extend toward the pixel electrode 18 from the scan line 12. The two data lines 13 arranged between every two adjacent columns of spaces 181 can include a first data line 131 and a second data line 132. The first data line 131 and the second data line 132 can each be electrically coupled to each of the source electrodes 15 of the corresponding column of spaces 181 to transmit corresponding data signals to the corresponding pixel electrodes 15.

Figure 3:
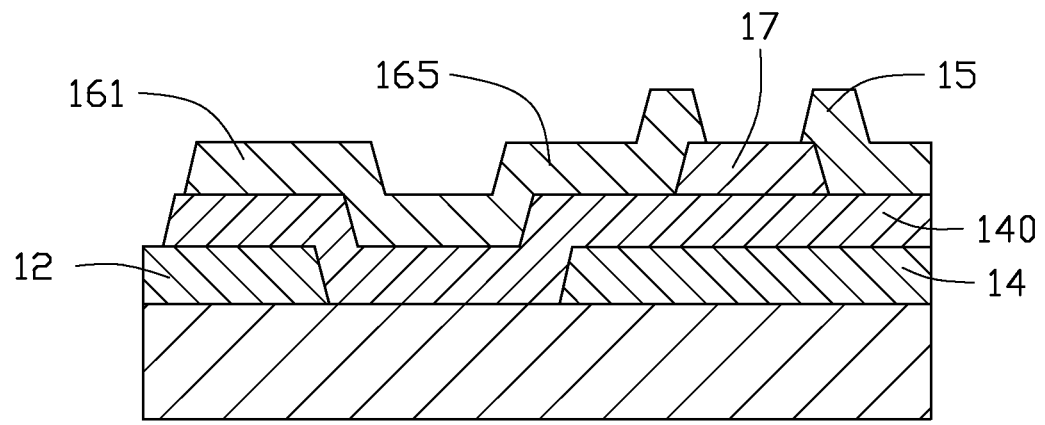
FIG. 3 is a cross-sectional view of the first substrate of the active array matrix of FIG. 2.

As illustrated in FIG. 3, the plurality of scan lines 12 and the plurality of gate electrodes 14 can be arranged in a first metal layer (not labeled). A gate insulation layer 140 can be covered over the first metal layer and electrically insulate the plurality of scan lines 12 from the plurality of gate electrodes 14. The plurality of source electrodes 15 and the plurality of drain electrodes 16 can be arranged in a second metal layer (not labeled). Each source electrode 15 and the corresponding drain electrode 16 can be arranged on opposite sides of a corresponding portion of a channel layer 17 arranged on the gate insulation layer 140. The plurality of pixel electrodes 18 can be arranged in a pixel electrode layer (not shown) of the first substrate 10.

Figure 2:
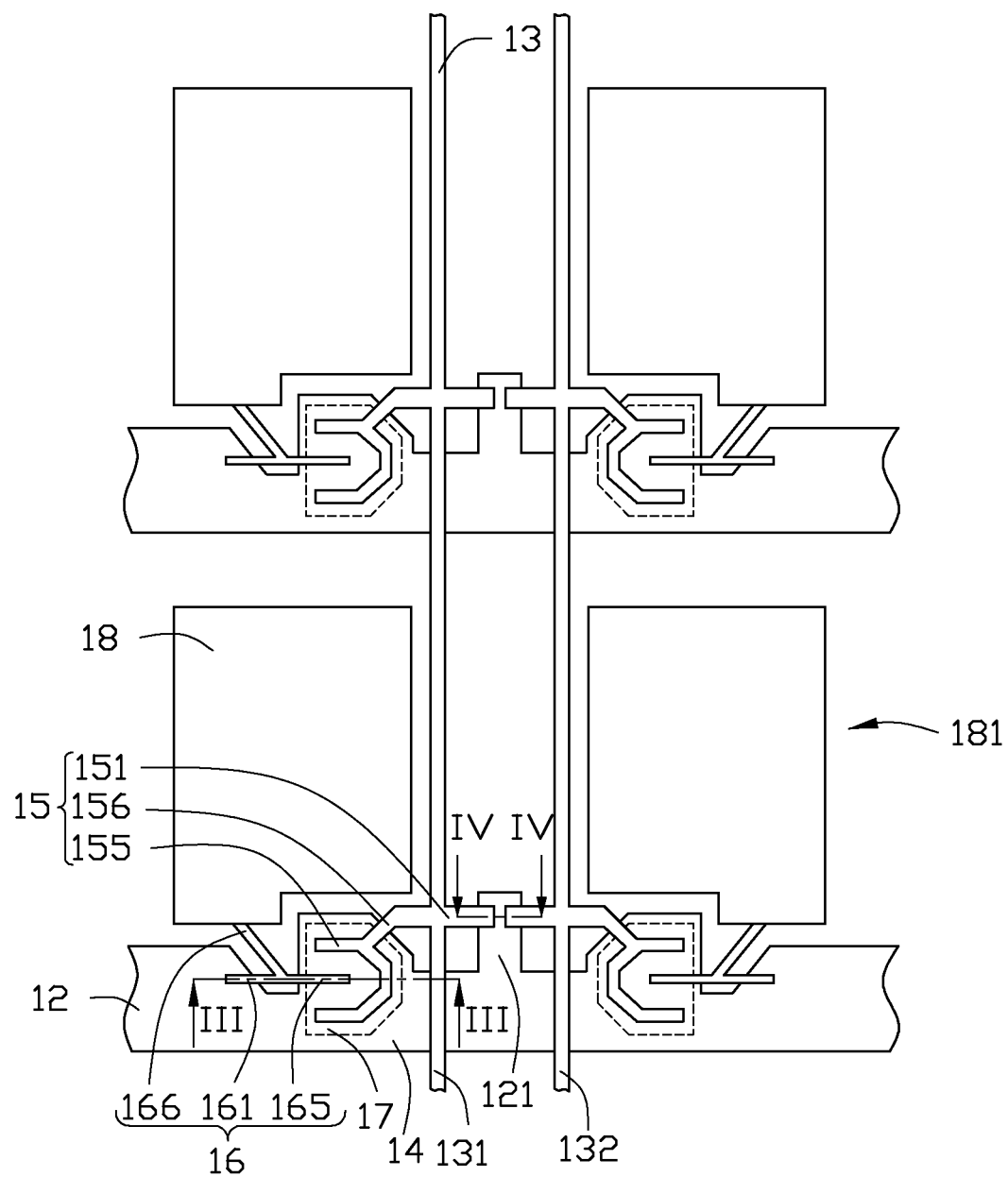
FIG. 2 is a top-plan view of a first embodiment of a first substrate of the active array matrix.
Figure 4:
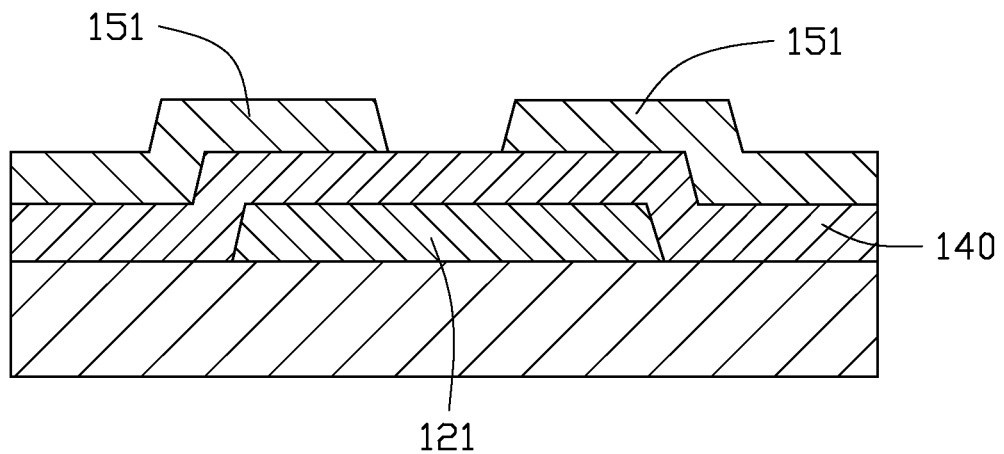
FIG. 4 is another cross-sectional view of the first substrate of the active array matrix of FIG. 2.

As illustrated in FIGS. 2-4, the scan line 12 can include a protruding portion 121 arranged between the first data line 131 and the second data line 132. The source electrode 15 can include a source extending portion 151 extending from one side of the corresponding data line 13 toward the protruding portion 121. In at least one embodiment, the source extending portion 151 is spaced from and partially overlaps with the protruding portion 121. In at least one embodiment, the source extending portion 151 overlapping with the protruding portion 121 can form a first capacitance.

Referring again to FIG. 2, the source electrode 15 can include a main body 155 and a first connecting portion 156. The connecting portion 156 can connect the main body 155 to the corresponding data line 13 to electrically couple the main body 155 to the corresponding data line 13. The main body 155 and the connecting portion 156 can be arranged on a side of the corresponding data line 13 opposite to the source extending portion 151. The main body 155 can be spaced from and overlap with the gate electrode 14.

The drain electrode 16 can include a drain extending portion 161, an inserting portion 165, and a second connecting portion 166. The inserting portion 165 can be spaced from and overlap with the gate electrode 14 and be arranged in a space surrounded by the main body 155 of the source electrode 15. In at least one embodiment, the main body of the source electrode 15 can be substantially C-shaped, and the inserting portion 165 can be surrounded by opposite sides of the main body 155. The second connecting portion 166 can be connected between the inserting portion 165 and the pixel electrode 18 to electrically couple the inserting portion 165 to the pixel electrode 18. The drain extending portion 161 can be electrically coupled to the inserting portion 165 and the second connecting portion 166. The drain extending portion 161 can overlap with the scan line 12. The drain extending portion 161 overlapping with the scan line 12 can form a second capacitance. In at least one embodiment, the drain extending portion 161 can be substantially parallel to the scan line 12.

Figure 5:
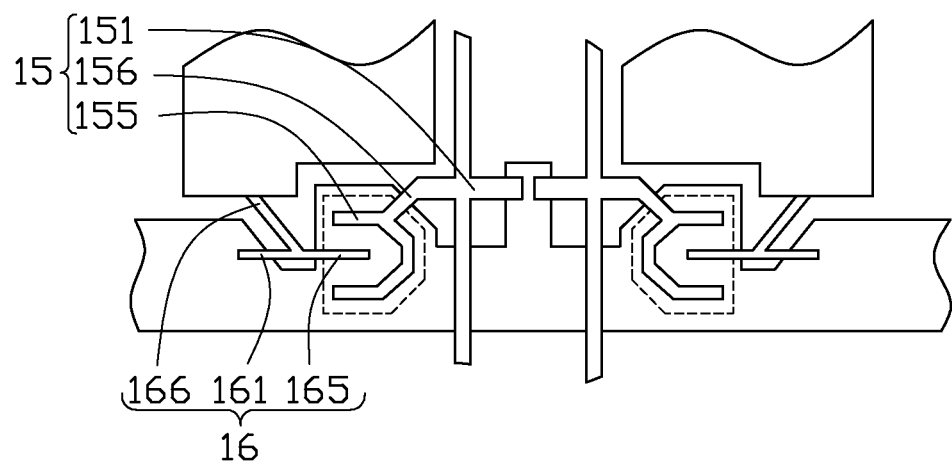
FIG. 5 is a top-plan view showing a shift in position of a first metal layer relative to a second metal layer of the first substrate of FIG. 2.
Figure 5:
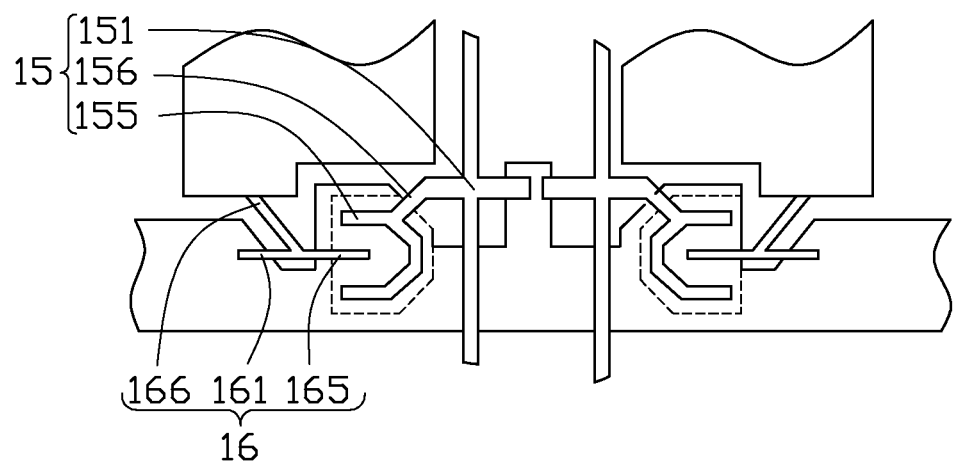

As illustrated in FIG. 5, positions of the first metal layer and the second metal layer may shift relative to each other due to manufacturing errors. When an overlapping area between the main body 155 and the first connecting portion 156 of the source electrode 15 and the gate electrode 14 increases, an overlapping area between the source extending portion 151 and the protruding portion 121 decreases. When the overlapping area between the main body 155 and the first connecting portion 156 of the source electrode 15 and the gate electrode 14 decreases, the overlapping area between the source extending portion 151 and the protruding portion 121 increases. Thus, when the positions of the first metal layer and the second metal layer shift relative to each other, a capacitance between the source electrode 15 and the first metal layer (i.e., the scan line 12 and the gate electrode 14) is preserved. When an overlapping area between the inserting portion 165 of the drain electrode 16 and the gate electrode 14 increases, an overlapping area between the drain extending portion 161 and the scan line 12 decreases. When the overlapping area between the inserting portion 165 and the gate electrode 14 decreases, the overlapping area between the drain extending portion 161 and the scan line 12 increases. Thus, when the positions of the first metal layer and the second metal layer shift relative to each other, a capacitance between the drain electrode 16 and the first metal layer (that is, the scan line 12 and the gate electrode 14) is preserved.

Figure 6:
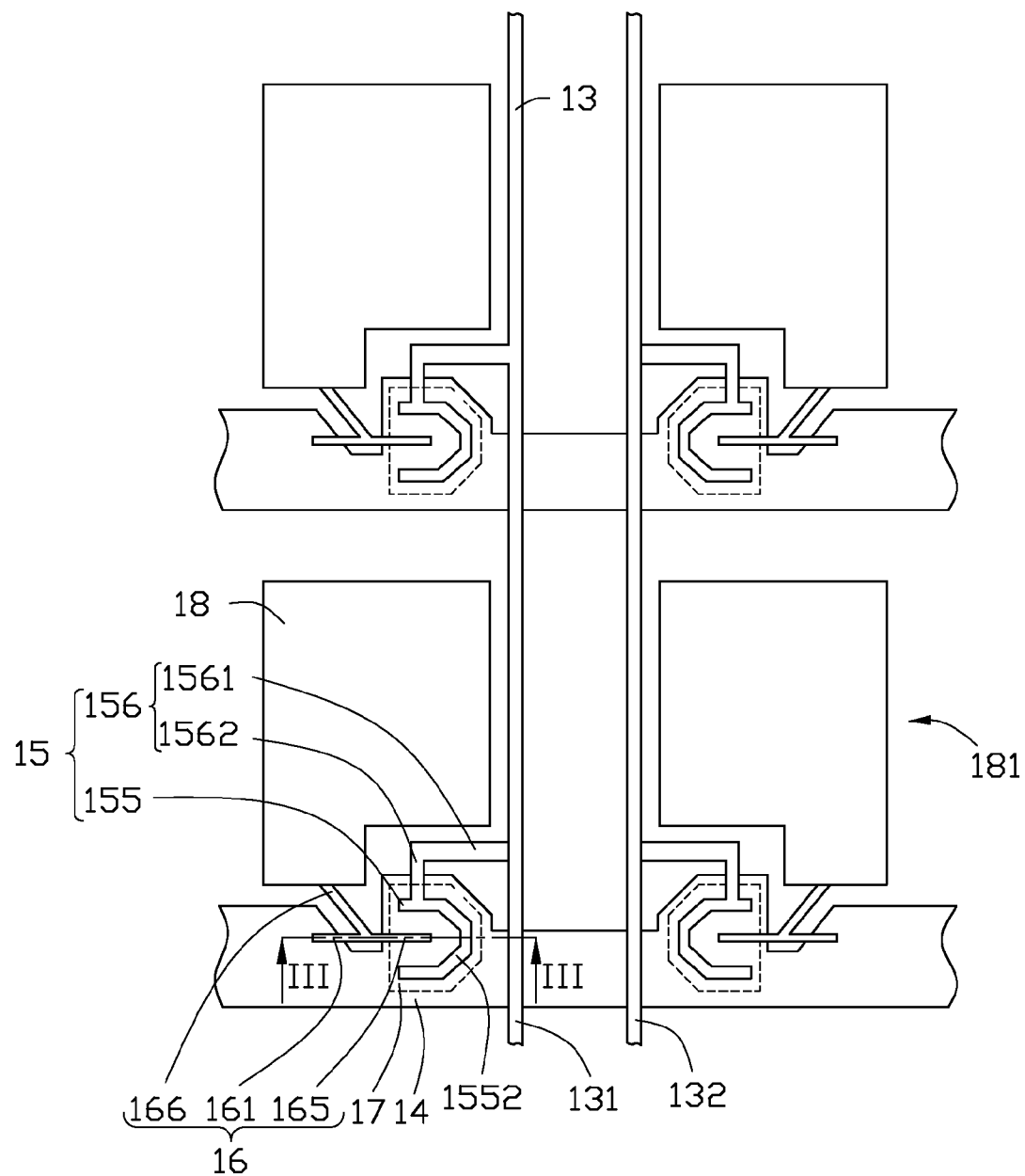
FIG. 6 is a top-plan view of a second embodiment of a first substrate of the active array matrix.
Figure 7:
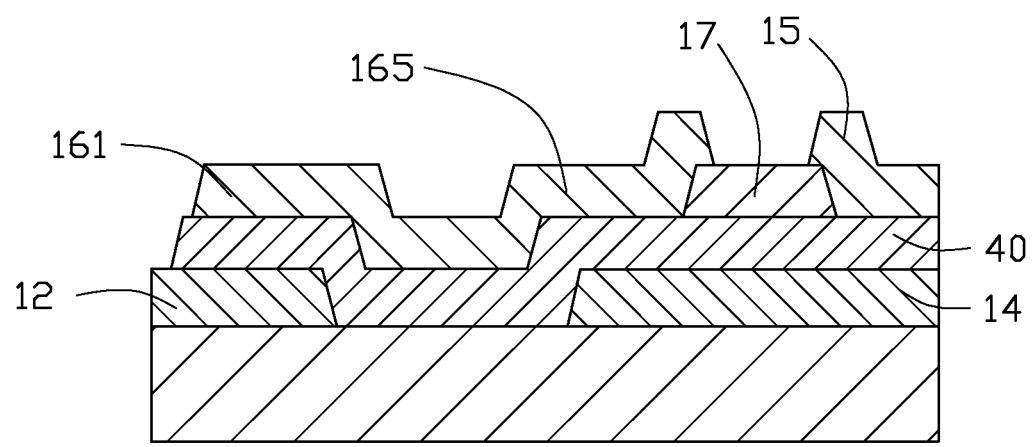
FIG. 7 is a cross-sectional view of the first substrate of the active array matrix of FIG. 6.
Figure 8:
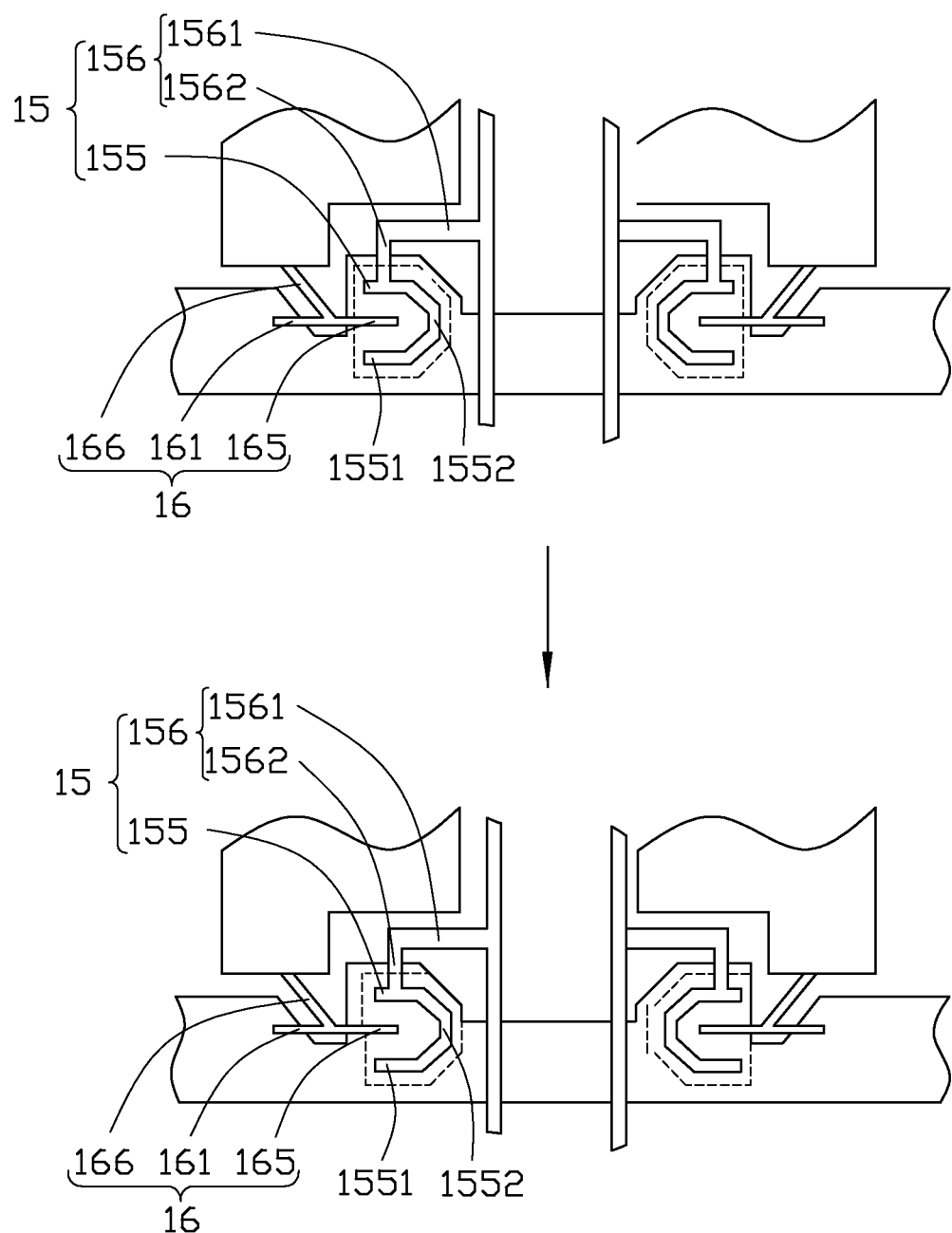
FIG. 8 is a top-plan view showing a shift in position of a first metal layer relative to a second metal layer of the first substrate of FIG. 6.

FIGS. 6-8 illustrate a second embodiment of the first substrate 10. The first substrate 10 can include a plurality of scan lines 12, a plurality of data lines 13, a plurality of gate electrodes 14, a plurality of source electrodes 15, a plurality of drain electrodes 16, and a plurality of pixel electrodes 18. The plurality of scan lines 12 can be substantially parallel to each other. The plurality of data lines 13 can be substantially parallel to each other and substantially perpendicular to the plurality of scan lines 12. The plurality of scan lines 12 can define a plurality of rows of spaces 181. Each row of spaces 181 can be bound by two adjacent scan lines 12. Two data lines 13 can be arranged between every two adjacent columns of spaces 181. Thus, the number of data lines 13 is twice the number of scan lines 12. Each of the spaces 181 can correspond in position to one corresponding gate electrode 14, one corresponding source electrode 15, one corresponding drain electrode 16, and one corresponding pixel electrode 18. The gate electrode 14 can extend toward the pixel electrode 18 from the scan line 12. The two data lines 13 arranged between every two adjacent columns of spaces 181 can include a first data line 131 and a second data line 132. The first data line 131 and the second data line 132 can each be electrically coupled to each of the source electrodes 15 of the corresponding column of spaces 181 to transmit corresponding data signals to the corresponding pixel electrodes 15.

As illustrated in FIG. 7, the plurality of scan lines 12 and the plurality of gate electrodes 14 can be arranged in a first metal layer (not labeled). A gate insulation layer 140 can be covered over the first metal layer and electrically insulate the plurality of scan lines 12 from the plurality of gate electrodes 14. The plurality of source electrodes 15 and the plurality of drain electrodes 16 can be arranged in a second metal layer (not labeled). Each source electrode 15 and the corresponding drain electrode 16 can be arranged on opposite sides of a corresponding portion of a channel layer 17 arranged on the gate insulation layer 140. The plurality of pixel electrodes 18 can be arranged in a pixel electrode layer (not shown) of the first substrate 10.

Referring to FIG. 6 and FIG. 8, the source electrode 15 can include a main body 155 and a connecting segment 156. The connecting segment 156 can connect the main body 155 to the corresponding data line 13 to electrically couple the main body 155 to the corresponding data line 13. The connecting segment 156 can include a first connecting portion 1561 and a source extending portion 1562. The first connecting portion 1561 can be connected between the source extending portion 1562 and the corresponding data line 13, and the source extending portion 1562 can be connected between the main body 155 and the first connecting portion 1561. The main body 155 can be electrically coupled to the corresponding data line 13 through the first connecting portion 1561 and the source extending portion 1562. The main body 155 can be spaced from and overlap with the gate electrode 14. The source extending portion 1562 can overlap with the gate electrode 14. In at least one embodiment, the source extending portion 1562 overlapping with the gate electrode 14 can form a first capacitance.

The drain electrode 16 can include a drain extending portion 161, an inserting portion 165, and a second connecting portion 166. The inserting portion 165 can be spaced from and overlap with the gate electrode 14 and be arranged in a space surrounded by the main body 155 of the source electrode 15. In at least one embodiment, the main body of the source electrode 15 can be substantially C-shaped, and the inserting portion 165 can be surrounded by opposite sides of the main body 155. The second connecting portion 166 can be connected between the inserting portion 165 and the pixel electrode 18 to electrically couple the inserting portion 165 to the pixel electrode 18. The drain extending portion 161 can be electrically coupled to the inserting portion 165 and the second connecting portion 166. The drain extending portion 161 can overlap with the scan line 12. The drain extending portion 161 overlapping with the scan line 12 can form a second capacitance. In at least one embodiment, the drain extending portion 161 can be substantially parallel to the scan line 12.

As illustrated in FIG. 8, positions of the first metal layer and the second metal layer may shift relative to each other due to manufacturing errors. When the positions of the first metal layer and the second metal layer shift relative to each other along a direction substantially parallel to the plurality of scan lines 12, an overlapping area between the source electrode 15 and the gate electrode 14 does not change because an overlapping area between the source extending portion 1562 and the gate electrode 14 does not change. When the positions of the first metal layer and the second metal layer shift relative to each other along a direction substantially parallel to the plurality of data lines 13, a change in the overlapping area between the source extending portion 1562 and the gate electrode 14 electrically coupled to the first data line 131 of the two data lines 13 arranged between the two spaces 181 is equal to a change in the overlapping area between the source extending portion 1562 and the gate electrode 14 electrically coupled to the second data line 132 of the two data lines 13 arranged between the two spaces 181. Thus, when the positions of the first metal layer and the second metal layer shift relative to each other, a capacitance between the source electrode 15 and the first metal layer (i.e., the scan line 12 and the gate electrode 14) is preserved. When an overlapping area between the inserting portion 165 of the drain electrode 16 and the gate electrode 14 increases, an overlapping area between the drain extending portion 161 and the scan line 12 decreases. When the overlapping area between the inserting portion 165 and the gate electrode 14 decreases, the overlapping area between the drain extending portion 161 and the scan line 12 increases. Thus, when the positions of the first metal layer and the second metal layer shift relative to each other, a capacitance between the drain electrode 16 and the first metal layer (i.e., the scan line 12 and the gate electrode 14) is preserved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An active array matrix substrate of a display panel, the active array matrix substrate comprising:
   a first substrate;
   a plurality of scan lines parallel to each other and arranged in a first metal layer of the first substrate, each pair of scan lines bounding a corresponding row of spaces, each space corresponding in position to a corresponding pixel of the display panel;
   a plurality of data lines parallel to each other and arranged in a second metal layer of the first substrate, the plurality of data lines being perpendicular to the plurality of scan lines, and two data lines arranged between every two adjacent columns of spaces;
   a plurality of gate electrodes arranged in the first metal layer, each of the plurality of gate electrodes corresponding in position to one corresponding space;
   a plurality of source electrodes arranged in the second metal layer, each of the plurality of source electrodes corresponding in position to one corresponding space, and each of the plurality of source electrodes comprising at least one source extending portion spaced apart from and configured to overlap with the first metal layer; and
   a plurality of drain electrodes arranged in the second metal layer, each of the plurality of drain electrodes corresponding in position to one corresponding space, and each of the plurality of drain electrodes comprising at least one drain extending portion spaced apart from and configured to overlap with the first metal layer;
   wherein the first substrate further comprises:
      a gate insulating layer covered over the first metal layer and configured to electrically insulate the plurality of scan lines from the plurality of data lines;
      a channel layer arranged on the gate insulating layer and positioned opposite to the plurality of gate electrodes; and
      a plurality of pixel electrodes, each of the plurality of pixel electrodes corresponding in position to one corresponding space and configured to receive a corresponding data signal from one corresponding data line;
   wherein the source electrode and the drain electrode of each space are arranged on opposite sides of a corresponding portion of the channel layer;
   wherein the at least one source extending portion and the first metal layer forms a first capacitor;
   wherein the at least one drain extending portion and the first metal layer forms a second capacitor;
   wherein each of the plurality of source electrodes is electrically coupled to one corresponding data line;
   wherein each of the plurality of gate electrodes is electrically coupled to one corresponding scan line; and
   wherein each of the plurality of drain electrodes is electrically coupled to one corresponding pixel electrode;
   wherein each of the plurality of source electrodes comprises:
      a main body spaced apart from the gate electrode; and
      a first connecting portion connected between the main body and the corresponding data line to electrically couple the main body to the corresponding data line;
   wherein the source extending portion and the first connecting portion extend from opposite sides of the corresponding data line;
   wherein each of the plurality of scan lines comprises a protruding portion arranged between the corresponding two data lines arranged between two adjacent columns of spaces;
   wherein the source extending portion overlaps with the protruding portion; and
   wherein the source extending portion and the protruding portion cooperatively form the first capacitor.

2. The active array matrix substrate as in claim 1, wherein:
   when an overlapping area between the source electrode and the gate electrode increases, an overlapping area between the source extending portion and the protruding portion decreases; and
   when the overlapping area between the source electrode and the gate electrode decreases, the overlapping area between the source extending portion and the protruding portion increases.

3. The active array matrix substrate as in claim 2, wherein the drain electrode comprises:
   an inserting portion spaced from and overlapping with the gate electrode, the inserting portion surrounded by the main body of the source electrode; and a second connecting portion connected between the inserting portion and the pixel electrode to electrically couple the inserting portion to the pixel electrode.

4. The active array matrix substrate as in claim 3, wherein:
the drain extending portion is electrically coupled to the inserting portion and the second connecting portion;
the drain extending portion overlaps with the scan line; and
the drain extending portion and the scan line form the second capacitor.

5. The active array matrix substrate as in claim 4, wherein:
when an overlapping area between the inserting portion and the gate electrode increases, an overlapping area between the drain extending portion and the scan line decreases; and
when the overlapping area between the inserting portion and the gate electrode decreases, the overlapping area between the drain extending portion and the scan line increases.

6. An active array matrix substrate of a display panel, the active array matrix substrate comprising:
a first substrate;
a plurality of scan lines parallel to each other and arranged in a first metal layer of the first substrate, each pair of scan lines bounding a corresponding row of spaces, each space corresponding in position to a corresponding pixel of the display panel;
a plurality of data lines parallel to each other and arranged in a second metal layer of the first substrate, the plurality of data lines being perpendicular to the plurality of scan lines, and two data lines arranged between every two adjacent columns of spaces;
a plurality of gate electrodes arranged in the first metal layer, each of the plurality of gate electrodes corresponding in position to one corresponding space;
a plurality of source electrodes arranged in the second metal layer, each of the plurality of source electrodes corresponding in position to one corresponding space, and each of the plurality of source electrodes comprising at least one source extending portion spaced from and configured to overlap with the first metal layer; and
a plurality of drain electrodes arranged in the second metal layer, each of the plurality of drain electrodes corresponding in position to one corresponding space, and each of the plurality of drain electrodes comprising at least one drain extending portion spaced from and configured to overlap with the first metal layer;
wherein the first substrate comprises:
a gate insulating layer covered over the first metal layer and configured to electrically insulate the plurality of scan lines from the plurality of data lines;
a channel layer arranged on the gate insulating layer and positioned opposite to the plurality of gate electrodes across the gate insulating layer; and
a plurality of pixel electrodes, each of the plurality of pixel electrodes corresponding in position to one corresponding space and configured to receive a corresponding data signal from one corresponding data line;
wherein the source electrode and the data electrode of each space are arranged on opposite sides of a corresponding portion of the channel layer;
wherein the at least one source extending portion and the first metal layer form a first capacitor;
wherein the at least one drain extending portion and the first metal layer forms a second capacitor;
wherein each of the plurality of source electrodes is electrically coupled to one corresponding data line;
wherein each of the plurality of gate electrodes is electrically coupled to one corresponding scan line;
wherein each of the plurality of drain electrodes is electrically coupled to one corresponding pixel electrode;
wherein each of the plurality of source electrodes comprises:
a main body spaced apart from the gate electrode; and
a connecting segment configured to connect the main body to the corresponding data line to electrically couple the main body to the corresponding data line;
wherein the main body comprises two arm segments and a linking segment;
wherein the two arm segments are parallel to each other;
wherein the connecting segment comprises the source extending portion and a first connecting portion;
wherein the source extending portion is connected between one of the arm segments of the main body and the first connecting portion;
wherein the first connecting portion is connected between the source extending portion and the corresponding data line;
wherein the source extending portion is parallel to the corresponding data line;
wherein the first connecting portion is parallel to the scan line;
wherein the main body of the source electrode is electrically coupled to the corresponding data line through the first extending portion and the first connecting portion;
wherein the source extending portion overlaps with the gate electrode; and
wherein the source extending portion and the gate electrode forms the first capacitor.

7. The active array matrix substrate as in claim 6, wherein:
when a position of the first metal layer shifts relative to the second metal layer along a direction parallel to the plurality of scan lines, an overlapping area between the source extending portion and the gate electrode does not change; and
when a position of the first metal layer shifts relative to the second metal layer along a direction parallel to the plurality of data lines, a change in the overlapping area between the source extending portion and the gate electrode electrically coupled to a first data line of the two data lines arranged between the two spaces is equal to a change in the overlapping area between the source extending portion and the gate electrode electrically coupled to a second data line of the two data lines arranged between the two spaces.

8. The active array matrix substrate as in claim 7, wherein the drain electrode comprises:
an inserting portion spaced from and overlapping with the gate electrode, the inserting portion is surrounded by the main body of the source electrode; and
a second connecting portion connected between the inserting portion and the pixel electrode to electrically couple the inserting portion to the pixel electrode.

9. The active array matrix substrate as in claim 8, wherein:
the drain extending portion is electrically coupled to the inserting portion and the second connecting portion;
the drain extending portion overlaps with the scan line; and
the drain extending portion and the scan line form the second capacitor.

10. The active array matrix substrate as in claim 9, wherein:

when an overlapping area between the inserting portion and the gate electrode increases, an overlapping area between the drain extending portion and the scan line decreases; and when the overlapping area between the inserting portion and the gate electrode decreases, the overlapping area between the drain extending portion and the scan line increases.

11. An active array matrix substrate of a display panel, the active array matrix substrate comprising:

a plurality of pixels in rows and columns;

a first substrate;

a first metal layer on the first substrate, the first metal layer forming a plurality of scan lines parallel to each other and a plurality of gate electrodes, every two adjacent scan lines bounding a corresponding row of pixels; and a second metal layer on the first substrate, the second metal layer forming a plurality of data lines parallel to each other, a plurality of source electrodes, and a plurality of drain electrodes; the plurality of data lines being perpendicular to the plurality of scan lines, two data lines arranged between every two adjacent columns of pixels, each of the plurality of source electrodes corresponding in position to one corresponding pixel, each of the plurality of drain electrodes corresponding in position to one pixel;

wherein each of the plurality of source electrodes is electrically coupled to one of the plurality of data lines;

wherein each of the plurality of source electrodes comprises a main body, a first connecting portion connected between the main body and one corresponding data line, and a source extending portion;

wherein the source extending portion and the first connecting portion extend from opposite sides of the corresponding data line;

wherein each of the plurality of scan lines comprises a protruding portion arranged between corresponding two data lines arranged between two adjacent columns of pixels;

wherein the source extending portion is configured to overlap with the protruding portion; and wherein the source extending portion and the protruding portion form a first capacitor.

12. The active array matrix substrate as in claim 11, further comprising:

a plurality of pixel electrodes, each of the plurality of pixel electrodes corresponding to one corresponding pixel;

wherein each of the plurality of drain electrodes is electrically coupled to one corresponding pixel electrode;

wherein each of the plurality of drain electrodes comprises:

an inserting portion surrounded by the main body of the source electrode; and a second connecting portion connected between the inserting portion and the pixel electrode.

13. The active array matrix substrate as in claim 12, wherein:

the drain extending portion is electrically coupled to the inserting portion and the second connecting portion;

the drain extending portion overlaps with the scan line; and the drain extending portion and the scan line form a second capacitor.

* * * * *